(12) United States Patent
Cruz et al.

(10) Patent No.: US 6,599,173 B1
(45) Date of Patent: Jul. 29, 2003

(54) METHOD TO PREVENT LEAVING RESIDUAL METAL IN CMP PROCESS OF METAL INTERCONNECT

(75) Inventors: Jose L. Cruz, Essex Junction, VT (US); Cuc K. Huynh, Jericho, VT (US); Timothy C. Krywanczyk, Essex Junction, VT (US); Douglas K. Sturtevant, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 09/608,941

(22) Filed: Jun. 30, 2000

(51) Int. Cl.$^7$ ................................. B24B 7/22
(52) U.S. Cl. ......................... 451/41; 451/57
(58) Field of Search ............... 451/41, 57, 37; 438/691, 692, 693, 745, 754; 252/79.1

(56) References Cited

U.S. PATENT DOCUMENTS

| | | |
|---|---|---|
| 5,637,185 A | 6/1997 | Murarka et al. |
| 5,676,587 A | 10/1997 | Landers et al. |
| 5,958,288 A | 9/1999 | Mueller et al. |
| 5,972,787 A | 10/1999 | Boggs et al. |
| 5,980,775 A * | 11/1999 | Grumbine et al. ......... 252/79.1 |
| 5,985,679 A | 11/1999 | Berman |
| 5,993,685 A * | 11/1999 | Currie et al. ............. 252/79.1 |
| 6,068,787 A * | 5/2000 | Grumbine et al. ......... 252/79.1 |
| 6,083,840 A * | 7/2000 | Mravic et al. ............. 438/693 |
| 6,294,105 B1 * | 9/2001 | Feeney et al. ............. 252/79.1 |

* cited by examiner

Primary Examiner—Robert A. Rose
(74) Attorney, Agent, or Firm—DeLio & Peterson, LLC; Kelly M. Reynolds; Robert A. Walsh

(57) ABSTRACT

A CMP slurry for and method of polishing a semiconductor wafer during formation of metal interconnects are disclosed. The present invention utilizes a first slurry comprising a first oxidizer, preferably ferric nitrate, to remove the excess metal of the metal interconnect but which leaves the metal residues on the surface of the wafer. A second slurry comprising another oxidizer, preferably potassium iodate solution, having a greater affinity to both the metal residue and the liner material than the underlying dielectric is used to remove the metal residue and liner material with significantly reduced scratching of the underlying dielectric. The more robust metal interconnects formed utilizing the present invention is effective in lowering the overall resistance of a wafer, reducing the number of shorts, and provides greater protection of the underlying dielectric. Overpolishing of the wafer and its associated problems are avoided.

22 Claims, 4 Drawing Sheets

METHOD TO PREVENT LEAVING RESIDUAL METAL IN CMP PROCESS OF METAL INTERCONNECT

BACKGROUND OF THE INVENTION

1. Field of the Invention

This invention relates to chemical mechanical planarization of integrated circuit surfaces, and in particular, to a composition and method of removing metal layers when forming interconnect structures. The composition and method of the present invention provides enhanced removal of residual metal and liner material from the interconnect structure while reducing scratching of the underlying dielectric layers.

2. Description of Related Art

Integrated circuits are chemically and physically integrated into a semiconductor substrate by patterning layers on the substrate. These layers can be conductive, for conductor and resistor fabrication. A thousand or more devices can be formed simultaneously on the surface of a single wafer of semiconductor material. It is essential for high device yields to start with a flat semiconductor wafer. If the process steps of device fabrication are performed on a wafer surface that is not planar, various problems can occur which may result in premature device failure. Since any irregularities on the wafer surface may be magnified as subsequent layers are formed thereon, it is desirable for the layers and the substrate to be as planar as possible.

Semiconductor fabrication generally comprises providing tungsten or copper wiring or metallization in discrete layers of dielectric oxide film. Typical oxides include silicon dioxide, phosphosilicate glass, borophosphosilicate glass, and other like materials. Thereafter, the oxide is etched to form vias or trenches. A liner material is blanket deposited as a thin layer into the trenches to provide good adhesion for the subsequent metal fill and acts as a diffusion barrier. The liner material generally comprise titanium, titanium nitride, tantalum, tantalum nitride and mixtures thereof. The subsequent metallization is conformally deposited comprising tungsten or copper. Thus, the filled trenches form lines and the filled holes form vias or interconnects. The process is typically completed when the liner material and metallization are removed using chemical mechanical planarization (CMP) down to the surface of the dielectric film.

Typically, during CMP, the semiconductor wafer is held against a rotating polishing pad surface under a controlled downward pressure. A slurry containing an abrasive and either a basic or acidic solution is provided to remove the liner material and copper or tungsten metallization. Problems arising from this methodology involve sufficient removal of the metallization and liner material which may create isolated metal islands which can lead to shorts in the semiconductor device.

Oftentimes, the metallization, particularly with the tungsten, is removed by over-polishing the surface of the wafer to ensure that there are no metal residues remaining. Any metal residues which remain are not removed in subsequent steps and may lead to shorts in the device. However, the over-polishing tends to cause "dishing," erosion of the metallization within the via or interconnect, which leads to metal open defects. Furthermore, the liner material has proven problematic in its removal, tending to remain behind in localized topography caused by prior level "dishing" and in scratches of the wafer surface.

Attempts to remove the liner material also result in surface defects of the underlying dielectric. It is common to continue the CMP until substantially all of the liner material has been removed from the underlying dielectric and follow up with another step for touching up the dielectric surface. The follow up hopes to remove any residual liner material and replanarize the dielectric surface to correct any defects caused by the CMP. However, care must be taken such that the dielectric is not eroded beyond acceptable process parameters particularly in areas of high density metallization.

U.S. Pat. No. 5,676,587 to Landers and assigned to the assignee of the present invention discloses a silica based slurry used to remove liner material comprising titanium/titanium nitride or tantalum/tantalum nitride. However, the slurry is ineffective in removing any tungsten residues which causes severe metal shorting in the resultant device. Therefore, the metallization must be over-polished in order to ensure thorough removal of the metallization and the liner material followed by recessing the dielectric layer. The silica based slurry used to remove the liner material does so efficiently without removing much tungsten or dielectric material. However, any tungsten residue that remains on the wafer service will create isolated metal islands leading to shorts and premature device failure.

Bearing in mind the problems and deficiencies of the prior art, it is therefore an object of the present invention to provide a CMP method which effectively removes metal residues and liner material, preferably in a single step.

It is another object of the present invention to provide a CMP method which effectively removes metal residues and liner material from a surface of the underlying dielectric without the need for over-polishing of the metallization.

A further object of the invention is to provide a CMP method which effectively removes metal residues and liner material which does away with the need for surface touch up of the dielectric.

It is yet another object of the present invention to provide an enhanced method of forming an interconnect structure which provides a substantially planar upper surface of the underlying dielectric layer.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of chemical mechanical polishing a semiconductor wafer surface having excess metal used in forming one or more metal interconnects comprising the steps of: polishing the wafer surface with a first oxidizer to remove a substantial portion of the excess metal while leaving a metal residue; and removing the metal residue with a second oxidizer having a higher affinity for the metal residue than the first oxidizer. Preferably, the step of polishing the wafer surface comprises polishing the wafer surface with an amount of ferric nitrate less than about 5 wt. % of a total amount of a polishing slurry. Additionally, the first oxidizer further includes an abrasive comprising alumina.

Preferably, the step of removing the metal residue with a second oxidizer comprises removing the metal residue and a liner material used in forming the interconnects. Most preferably, the step of removing the metal residue with a second oxidizer comprises removing the metal residue with postassium iodate wherein the slurry has a pH of about 7 to 9.

In a second aspect, the present invention is directed to a method of polishing a semiconductor wafer comprising the steps of: providing a semiconductor wafer having an interconnect structure wherein a top surface of the wafer has a blanket layer of liner material and a blanket layer of excess metal disposed thereover; chemical mechanical polishing the wafer to remove the blanket layer of excess metal with a first slurry comprising a metal oxidizing agent while leaving a metal residue; chemical mechanical polishing the wafer to remove the metal residue with a second slurry comprising another oxidizing agent having an affinity for the excess metal and the linear material; and prevent scratching of a dielectric material beneath the liner material.

Preferably, the step of providing a semiconductor wafer comprises providing a semiconductor wafer having an interconnect structure wherein a top surface of the wafer has a blanket layer of liner material comprising titanium nitride and a blanket layer of excess metal comprising tungsten disposed thereover, an interconnect structure wherein a top surface of the wafer has a blanket layer of liner material comprising tantalum nitride and a blanket layer of excess metal comprising tungsten disposed thereover, an interconnect structure wherein a top surface of the wafer has a blanket layer of liner material comprising titanium nitride and a blanket layer of excess metal comprising copper disposed thereover, or an interconnect structure wherein a top surface of the wafer has a blanket layer of liner material comprising tantalum nitride and a blanket layer of excess metal comprising copper disposed thereover.

In a third aspect, the present invention is directed to a slurry composition for chemical mechanical polishing to remove metal layers on a semiconductor wafer comprising: a first slurry comprising an aqueous alumina slurry and about 3 to 5 wt. % ferric nitrate based on a total weight of the composition; and a second slurry comprising an aqueous silica slurry and a sufficient amount of an oxidizer to provide a pH of about 7 to 9, wherein the first slurry removes the metal layers on the semiconductor wafer leaving a metal residue, and the second slurry removes the metal residue and a liner material beneath the metal layers. Preferably, the oxidizer is selected from the group consisting of potassium iodate, iodic acid, peroxide, and potassium permanganate with potassium iodate being most preferred.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
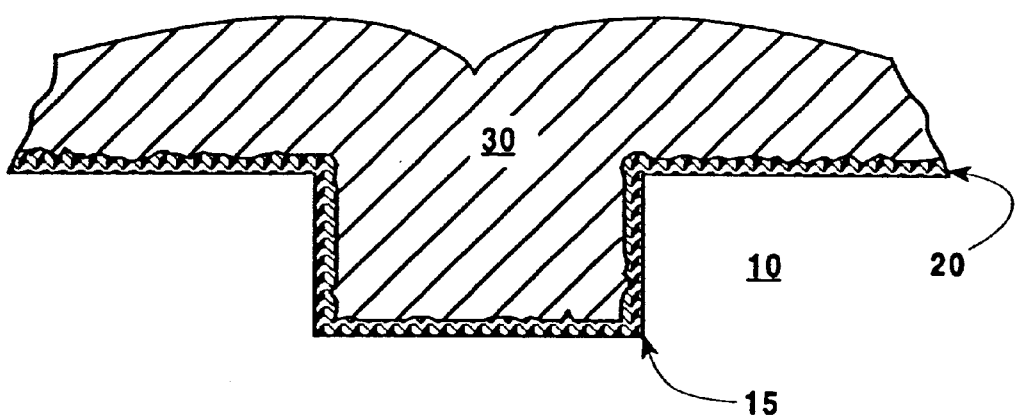
FIG. 1 is a cross-sectional view of a portion of an interconnect structure prior to chemical mechanical planarization in accordance with a method of the present invention.

In describing the preferred embodiment of the present invention, reference will be made herein to FIGS. 1–6 of the drawings in which like numerals refer to like features of the invention. Features of the invention are not necessarily shown to scale in the drawings.

The present invention provides an enhanced CMP methodology utilizing a first slurry to planarize the metallization wherein a metal residue may remain, and a second slurry which removes the liner material. The advantage lies in that the second slurry is selective to both the liner material and any metal residue remaining. The methodology of the present invention also significantly reduces scratching of the underlying dielectric layer.

In FIG. 1 is shown a cross-sectional view of a portion of an interconnect structure having a dielectric layer 10 in which a via 15 has been etched. Dielectric layer 10 may comprise any appropriate type of insulating material known in the art such as silicon dioxide, and different types of doped or undoped borosilicate of phosphosilicate glass. Via 15 is etched according to known methods in the art.

A conformal layer of liner material 20 is then deposited into via 15. Liner material 20 may comprise a single layer of titanium or tantalum. Alternatively, liner material 20 may comprise stacked layers of titanium/titanium nitride and tantalum/tantalum nitride. Liner material 20 enhances adhesion of the subsequent metallization and acts as a diffusion barrier to prevent parasitic charge leakages of the metallization into dielectric. Metallization 30 is conformally blanket deposited to fill in 14. Preferably, the metallization comprises tungsten and copper.

Figure 2:
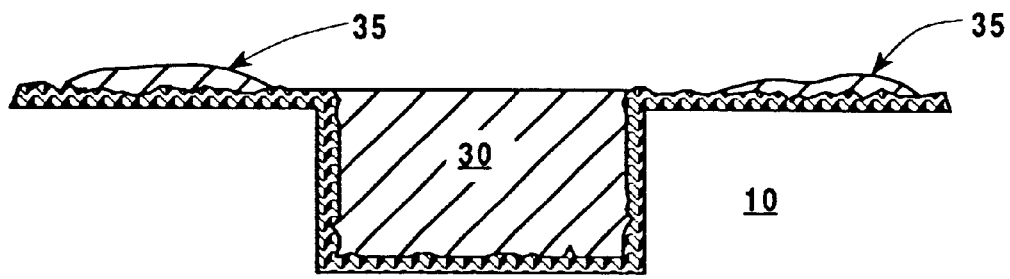
FIG. 2 is a cross-sectional view of a portion of the interconnect structure of FIG. 1 during chemical mechanical planarization in accordance with a method of the present invention.

In FIG. 2 the interconnect structure 40 has been planarized by CMP using a first slurry. It is acceptable to underpolish metallization 30 leaving a metal residue 35 of the metallization 30. Deliberate underpolishing metallization 30 prevents "dishing" and other surface defects. Polishing of the metallization may also continue until the liner material interface has been reached although this is not necessary. The first slurry includes a metal oxidizer, preferably ferric nitrate, and alumina abrasives in an aqueous composition. Ferric nitrate is present in an amount of about 3 to about 5 wt. % based on a total weight of the slurry composition. Such a small amount but effective amount of ferric nitrate has been shown to be effective in removing the metallization, particularly tungsten. The amount of ferric nitrate is of a sufficiently low concentration which decreases the environmental impact not found in prior art CMP methods. The alumina abrasives may be purchased as WA400 available from Cabot Microelectronics of Aurora, Ill. as a 6 wt. % alumina suspension. In a most preferred embodiment, about 6 liters of the WA400 is then mixed with about 26.5 liters of water and then mixed with the ferric nitrate solution to make up a 36 liter carboy of this first slurry.

A second slurry having another oxidizer is provided which has a greater affinity to both the metal residue 35 and liner material 20 than underlying dielectric 10. Preferably, the metal oxidizer of the second slurry having a selectivity of about 1:1.5 to the liner material versus dielectric 10. The second slurry removes metal residue 35 without creating substantial scratches and other surface defects in dielectric 10 and is also highly selective to liner material 20. Preferably, the oxidizing agent in the second slurry comprises an oxidizer selected from the group consisting of iodic acid, potassium iodate solution, a peroxide, potassium permanganate solution and combinations thereof.

Figure 3:
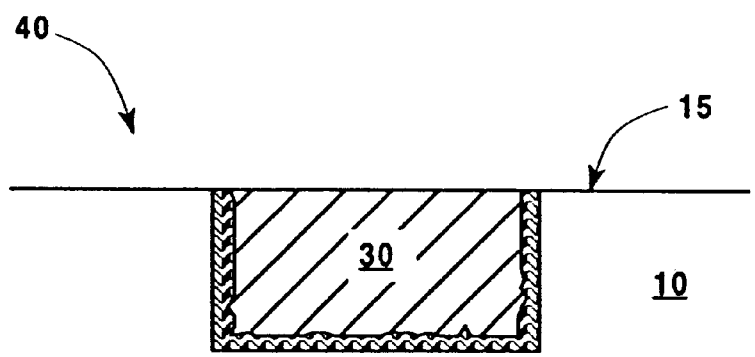
FIG. 3 is a cross-sectional view of a portion of the interconnect structure of FIGS. 1 and 2 after successful chemical mechanical planarization in accordance with a method of the present invention.

Potassium iodate is most preferred having shown to be effective in removing metal residue 35 comprising tungsten and liner material 20. The potassium iodate crystals are dissolved in an aqueous solution at a concentration of about 30 to about 40 grams/liter. The solution is then mixed with a silica abrasive such as Klebosol® available from Clariant Corp. of Martin, S.C. In a most preferred embodiment, about 800 ml of Klebesol® is added to about 16 liters of the potassium iodate solution. It is preferable that the slurry be slightly basic having a pH of about 7 to about 9 so that the silica particles do not coagulate. Silica abrasives are used in the second slurry since they have been found to be softer than the alumina abrasive effective in the first slurry composition. Thus, scratching and other surface defects such as "dishing" are reduced or avoided altogether. Unexpectedly, the higher affinity of the second slurry for liner material 20 than dielectric 10, provides fewer opportunities for the oxidized liner material to be imbedded in the polishing pad which can also contribute to additional scratching of the softer underlying dielectric. FIG. 3 illustrates an interconnect structure 40 as a result of the methodology of the present invention after planarization with the second slurry.

In comparative testing with wafers having metal interconnects formed using prior art techniques, wafers having metal interconnects formed using the method of the present invention shows significant reduction in resistance, number of shorts and scratches on the underlying dielectric. The wafers having prior art metal interconnects are represented by the square data points. Wafers having metal interconnects formed using the method of the present invention are represented by the triangular data points. Each data point on the x axis represents a wafer lot of 25 wafers.

Figure 4:
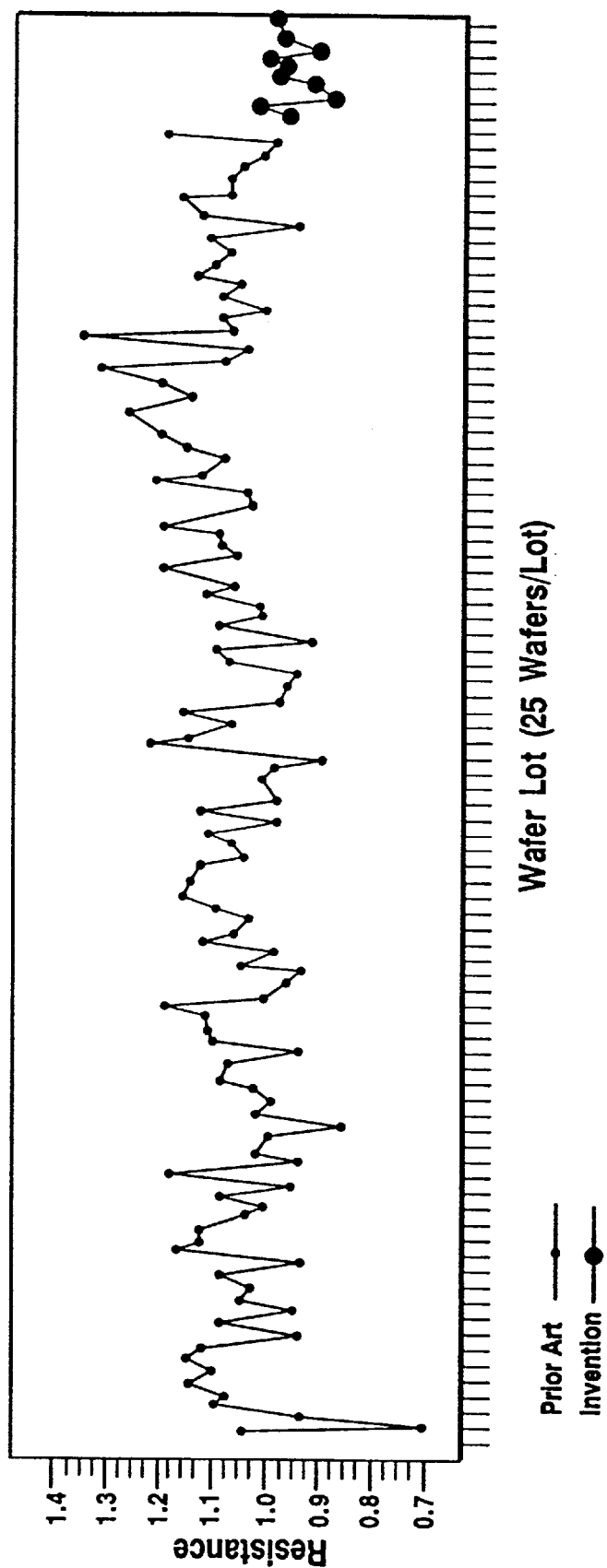
FIG. 4 is a graph comparing the resistance of semiconductor wafers having metal interconnects formed using prior art methods and wafers having metal interconnects formed using the method of the present invention.
Figure 5:
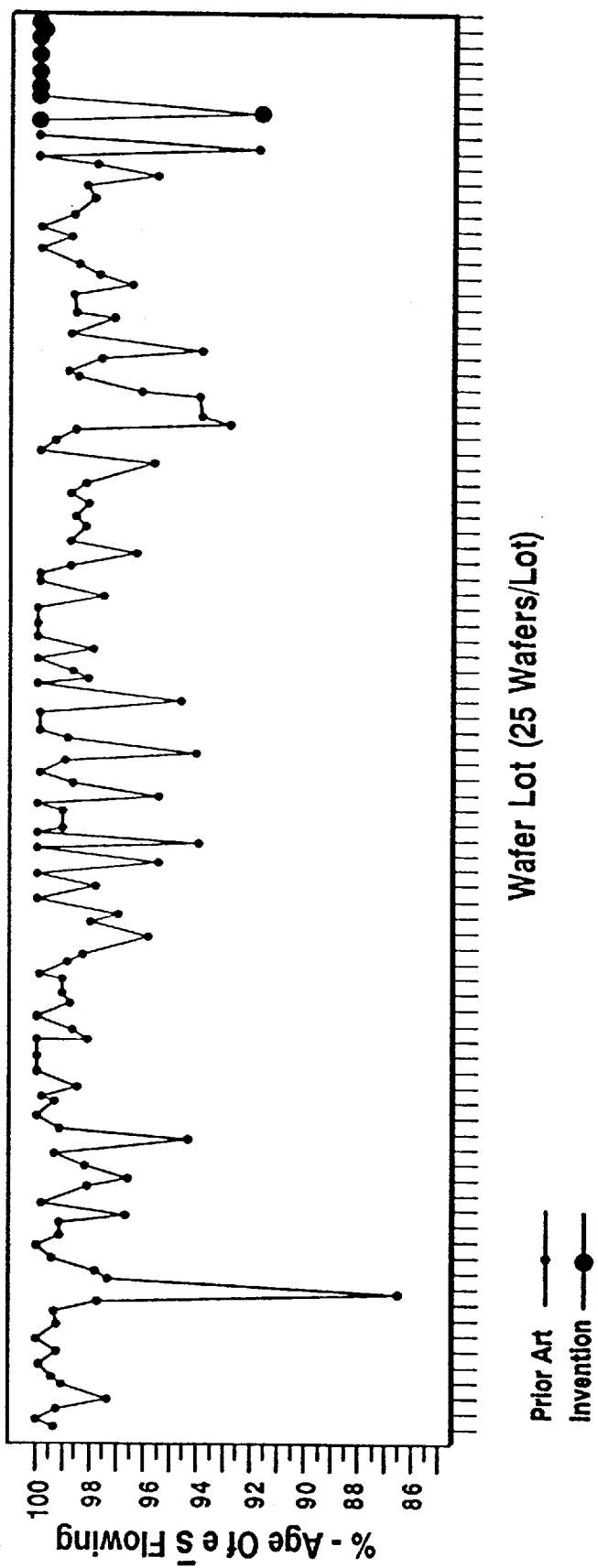
FIG. 5 is a graph comparing the percentage of electrons flowing through semiconductor wafers having metal interconnects formed using prior art methods and wafers having metal interconnects formed using the method of the present invention.
Figure 6:
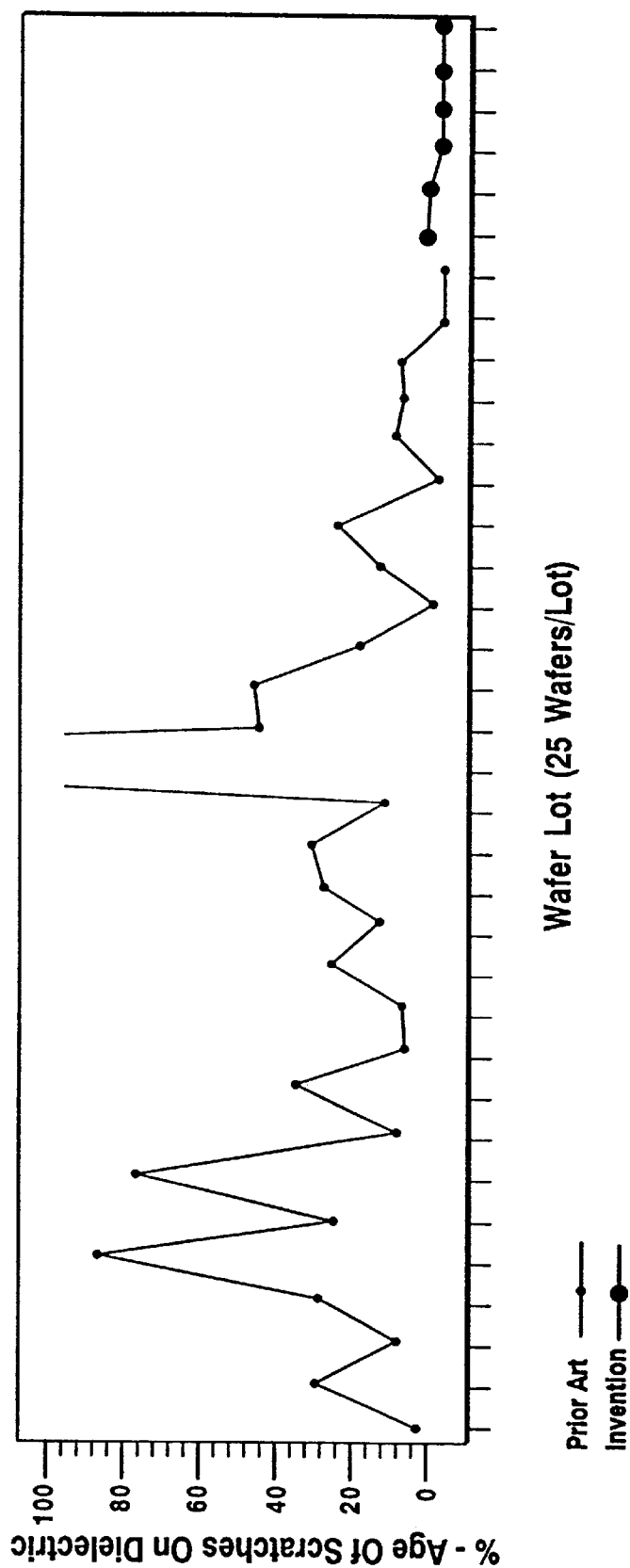
FIG. 6 is a graph comparing the number of scratches found in the underlying dielectric in semiconductor wafers having metal interconnects formed using prior art methods and wafers having metal interconnects formed using the method of the present invention.

In FIG. 4 is a graph illustrating the resistance for each wafer lot. There is significant variation in the resistance between each lot in the wafers having prior art metal interconnects. Advantageously, the resistance for the wafer lots having metal interconnects formed using the method of the present invention show a much tighter resistance variation with a lower overall resistance. In FIG. 5 is a graph illustrating the percentage of electrons flowing within the wafer. Again, the wafers having metal interconnects formed using the method of the present invention advantageously show about 100% electron flow indicating that there are substantially no shorts present in those wafer lots. In FIG. 6 is a graph comparing the number of scratches found in the underlying dielectric. The prior art wafers show not only an inconsistency in the quality of the dielectric after metal interconnect formation but also high instances of scratching from CMP. The wafers having metal interconnects formed using the method of the present invention show a marked reduction in the number of CMP scratches resulting from the CMP process.

The present invention achieves the objects recited above. Underpolishing of the interconnect metallization with a ferric nitrate slurry followed by polishing with a slurry containing a second oxidizer, preferably potassium iodate, successfully removes any remaining metal residue and the liner material while reducing surface defects of the underlying dielectric. The method provides significant reductions in wafer resistance, metal shorts and scratching of the underlying dielectric. Thus, a more robust interconnect structure is formed improving the service life of the resultant semiconductor device.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of chemical mechanical polishing a semiconductor wafer surface having excess metal used in forming one or more metal interconnects comprising the steps of:
   polishing the wafer surface with a first slurry comprising a first oxidizer and a first abrasive to remove a substantial portion of the excess metal while leaving a metal residue; and
   removing the metal residue with a second slurry comprising a second oxidizer and a second abrasive, said second slurry having a higher affinity for the metal residue than the first slurry.

2. The method of claim 1 wherein the step of polishing the wafer surface comprises polishing the wafer surface with an amount of ferric nitrate less than about 5 wt. % of a total amount of the first slurry.

3. The method of claim 1 wherein the step of polishing the wafer surface comprises removing a substantial portion of the excess metal of the one or more interconnects wherein the portion of the excess metal is removed to an interface at a liner material.

4. The method of claim 1 wherein the step of polishing the wafer surface to remove a substantial portion of the excess metal while leaving a metal residue with a first slurry, the first oxidizer comprises ferric nitrate.

5. The method of claim 1 wherein the step of polishing the wafer surface to remove a substantial portion of the excess metal while leaving a metal residue with a first slurry, the first abrasive comprises alumina.

6. The method of claim 1 wherein the step of removing the metal residue with a second slurry comprises removing the metal residue and a liner material used in forming the interconnects.

7. The method of claim 1 wherein the step of removing the metal residue with a second slurry, the second oxidizer comprises potassium iodate.

8. The method of claim 1 wherein the step of removing the metal residue with a second slurry comprises removing the metal residue with a slurry having a pH of about 7 to 9.

9. A method of polishing a semiconductor wafer comprising the steps of:
   providing a semiconductor wafer having an interconnect structure wherein a top surface of a dielectric layer of the wafer has a blanket layer of liner material and a blanket layer of excess metal disposed thereover;
   chemical mechanical polishing the wafer to remove a portion of the blanket layer of excess metal with a first slurry comprising a metal oxidizing agent and a first abrasive while leaving a metal residue; and
   chemical mechanical polishing the wafer to remove the metal residue with a second slurry comprising another oxidizing agent and a second abrasive, the second slurry having an affinity for the metal residue and the liner material whereby the second slurry removes the metal residue and the liner material while preventing scratches and surface defects in the underlying dielectric layer.

10. The method of claim 9 wherein the step of providing a semiconductor wafer comprises providing a semiconductor wafer having an interconnect structure wherein a top surface of a dielectric layer has a blanket layer of liner material comprising titanium nitride and a blanket layer of excess metal comprising tungsten disposed thereover.

11. The method of claim 9 wherein the step of providing a semiconductor wafer comprises providing a semiconductor wafer having an interconnect structure wherein a top surface of a dielectric layer has a blanket layer of liner material comprising tantalum nitride and a blanket layer of excess metal comprising tungsten disposed thereover.

12. The method of claim 9 wherein the step of providing a semiconductor wafer comprises providing a semiconductor wafer having an interconnect structure wherein a top surface of a dielectric layer the wafer has a blanket layer of liner material comprising titanium nitride and a blanket layer of excess metal comprising copper disposed thereover.

13. The method of claim 9 wherein the step of providing a semiconductor wafer comprises providing a semiconductor wafer having an interconnect structure wherein a top surface of a dielectric layer the wafer has a blanket layer of liner material comprising tantalum nitride and a blanket layer of excess metal comprising copper disposed thereover.

14. The method of claim 9 wherein the step of chemical mechanical polishing the wafer to remove the blanket layer of excess metal comprises polishing with a first slurry wherein the metal oxidizing agent comprises ferric nitrate.

15. The method of claim 9 wherein the step of chemical mechanical polishing the wafer to remove the blanket layer of excess metal comprises polishing with a first slurry comprising ferric nitrate and alumina.

16. The method of claim 9 wherein the step of chemical mechanical polishing the wafer to remove the blanket layer of liner material requires underpolishing the liner material thereby leaving the excess metal.

17. The method of claim 9 wherein the step of chemical mechanical polishing the wafer to remove the blanket layer of excess metal may comprise removing the blanket layer of excess metal to an interface between the excess metal and the liner material.

18. The method of claim 9 wherein the step of chemical mechanical polishing the wafer to remove the metal residue and the liner material comprises polishing with a second slurry having an oxidizer selected from the group consisting of potassium iodate, iodic acid, peroxide, and potassium permanganate, wherein the second slurry comprises a sufficient amount of the oxidizer such that the pH is about 7 to 9.

19. The method of claim 9 wherein the step of chemical mechanical polishing the wafer to remove the metal residue and the liner material comprises polishing with a second slurry comprising potassium iodate having a pH of about 7 to 9.

20. The method of claim 9 wherein the step of chemical mechanical polishing the wafer to remove the metal residue and the liner material comprises polishing with a second slurry comprising potassium iodate and silica.

21. The method of claim 9 wherein the step of chemical mechanical polishing the wafer to remove the metal residue and the liner material comprises polishing with a second slurry having 1:1.5 affinity to the liner material versus the underlying dielectric layer.

22. The method of claim 9 wherein the step of chemical mechanical polishing the wafer to remove the metal residue and the liner material removes any micro-scratches in the dielectric material made during the step of chemical mechanical polishing the excess metal and prevents erosion of the dielectric material.

* * * * *